United States Patent
Liang et al.

(10) Patent No.: US 12,430,821 B2
(45) Date of Patent: Sep. 30, 2025

(54) METHOD AND A SYSTEM FOR COMPRESSED ULTRAFAST TOMOGRAPHIC IMAGING

(71) Applicant: INSTITUT NATIONAL DE LA RECHERCHE SCIENTIFIQUE, Québec (CA)

(72) Inventors: Jinyang Liang, Boucherville (CA); Yingming Lai, Longueuil (CA)

(73) Assignee: INSTITUT NATIONAL DE LA RECHERCHE SCIENTIFIQUE, Québec (CA)

( * ) Notice: Subject to any disclaimer, the term of this patent is extended or adjusted under 35 U.S.C. 154(b) by 250 days.

(21) Appl. No.: 18/250,650

(22) PCT Filed: Oct. 27, 2021

(86) PCT No.: PCT/CA2021/051516
§ 371 (c)(1),
(2) Date: Apr. 26, 2023

(87) PCT Pub. No.: WO2022/094695
PCT Pub. Date: May 12, 2022

(65) Prior Publication Data
US 2023/0401765 A1      Dec. 14, 2023

Related U.S. Application Data

(60) Provisional application No. 63/109,025, filed on Nov. 3, 2020.

(51) Int. Cl.
*G06T 11/00* (2006.01)
*G06T 9/00* (2006.01)

(52) U.S. Cl.
CPC .............. *G06T 11/003* (2013.01); *G06T 9/00* (2013.01)

(58) Field of Classification Search
None
See application file for complete search history.

(56) References Cited

U.S. PATENT DOCUMENTS

| | | |
|---|---|---|
| 7,463,362 B2 | 12/2008 | Lasker et al. |
| 9,014,451 B2 | 4/2015 | Beg et al. |

(Continued)

FOREIGN PATENT DOCUMENTS

| | | |
|---|---|---|
| CN | 110160440 | 8/2019 |
| CN | 210036591 | 2/2020 |

(Continued)

OTHER PUBLICATIONS

International Search Report & Written Opinion issued in parent PCT application No. PCT/CA2021/051516 dated Jan. 24, 2022.

(Continued)

*Primary Examiner* — Leon Flores
(74) *Attorney, Agent, or Firm* — Gwendoline Bruneau; Lavery, de Billy, L.L.P.

(57) ABSTRACT

A method and a system for imaging a transient event, the method comprising passively recording spatiotemporal projections of the transient event in an angular range from −45° to +45°; and processing the recorded spatiotemporal projections by compressed sensing tomographic image reconstruction to recover the transient event. The system comprises an imaging unit and a shearing unit for imaging a dynamic event to different positions, a detector that records data by spatially integrating over each pixel and temporally integrating; and a processing unit that reconstructs the dynamic event from said data by compressed sensing tomographic image reconstruction.

12 Claims, 7 Drawing Sheets

(56) References Cited

U.S. PATENT DOCUMENTS

| | | | |
|---|---|---|---|
| 9,492,089 B2 | 11/2016 | Hielscher et al. | |
| 9,506,740 B2 | 11/2016 | Brezinzki et al. | |
| 9,775,511 B2 | 10/2017 | Kumar et al. | |
| 9,835,840 B2 | 12/2017 | Jalali et al. | |
| 9,867,542 B2 | 1/2018 | Wu et al. | |
| 10,458,921 B2 | 10/2019 | Brenner et al. | |
| 10,502,544 B2 | 12/2019 | Liu et al. | |
| 2004/0030255 A1* | 2/2004 | Alfano | A61B 5/415 600/476 |
| 2017/0105618 A1 | 4/2017 | Schmoll et al. | |
| 2018/0224552 A1 | 8/2018 | Wang et al. | |
| 2023/0125131 A1* | 4/2023 | Gao | H04N 23/957 349/15 |

FOREIGN PATENT DOCUMENTS

| | | |
|---|---|---|
| JP | 2015523578 | 8/2015 |
| JP | 2018510962 | 4/2019 |
| KR | 10-1263326 | 5/2013 |
| TW | 201333448 | 8/2013 |
| TW | 2015523578 | 10/2014 |

OTHER PUBLICATIONS

CN210036591U—Machine Translation_English.
CN110160440A—Machine Translation_English.
JP2019510962A—Machine Translation_English.
JP2015523578A—Machine Translation_English.
KR101266326B1—Machine Translation_English.
TW201333448A—Machine Translation_English.
TWM488016U—Machine Translation_English.
J. Liang and L. V. Wang, "Single-shot ultrafast optical imaging," Optica 5, 1113-1127 (2018).
H. Mikami, L. Gao, and K. Goda, "Ultrafast optical imaging technology: principles and applications of emerging methods," Nanophotonics 5, 497-509 (2016).
A. Velten et al., "Recovering three-dimensional shape around a corner using ultrafast time-of-flight imaging," Nature Communications 3, 745 (2012).
A. Velten et al.,, "Videos of light filamentation in air," Journal of Physics B: Atomic, Molecular and Optical Physics 48, 094020 (2015).
G. Satat, et al., "All Photons Imaging Through Volumetric Scattering," Scientific Reports 6, 33946 (2016).
R. Kienberger et al., "Atomic transient recorder," Nature 427, 817-821 (2004).
J. A. Russell et al., "Characterization of Fluorescence Lifetime of Photofrin and Delta-Aminolevulinic Acid Induced Protoporphyrin IX in Living Cells Using Single- and Two-Photon Excitation," IEEE Journal of Selected Topics in Quantum Electronics 14, 158-166 (2008).
Y. Ping et al., "Enhanced energy coupling for indirectly driven inertial confinement fusion," Nature Physics 15, 138-141 (2019).
Q. Hu et al., "Ultrafast fluorescent decay induced by metal-mediated dipole-dipole interaction in two-dimensional molecular aggregates," Proceedings of the National Academy of Sciences 114, 10017 (2017).
Hamamatsu Photonics, "Guide to Streak Cameras", retrieved https://www.hamamatsu.com/resources/pdf/sys/SHSS0006E_STREAK.pdf. (2008).
Axis Photonique Incorporation, "Axis-PX: Subpicosecond X-Ray Streak Camera", retrieved http://www.axis-photon.com/streak-camera/axis-px-subpicosecond-x-ray-streak-camera/.(2020).

D. Faccio et al., "A trillion frames per second: the techniques and applications of light-in-flight photography," Reports on Progress in Physics 81, 105901 (2018).
M. Drabbels et al., "Demonstration of a far-infrared streak camera," IEEE Journal of Quantum Electronics 34, 2138-2144 (1998).
J. B. M. Warntjes et al., "Atomic streak camera operating in the extreme ultraviolet," Review of Scientific Instruments 72, 3205-3207 (2001).
C. H. Sarantos et al., "Solid-state ultrafast all-optical streak camera enabling high-dynamic-range picosecond recording," Optics Letters 35, 1389-1391 (2010).
J. Itatani et al., "Attosecond Streak Camera," Physical Review Letters 88, 173903 (2002).
A. Velten et al., "Femto-photography: capturing and visualizing the propagation of light," Acm Transactions on Graphics 32, 8 (2013).
L. Gao et al., "Single-shot compressed ultrafast photography at one hundred billion frames per second," Nature 516, 74-77 (2014).
A. Tsikouras et al., "High-speed multifocal array scanning using refractive window tilting," Biomedical Optics Express 6, 3737-3747 (2015).
B. Heshmat et al., "Single-shot ultrafast imaging using parallax-free alignment with a tilted lenslet array," in CLEO: 2014, OSA Technical Digest (online) (Optical Society of America, 2014).
R. H. H. Scott et al., "A study of fast electron energy transport in relativistically intense laser-plasma interactions with large density scalelengths," Physics of Plasmas 19, 053104 (2012).
J. Liang et al., "Single-shot stereo-polarimetric compressed ultrafast photography for light-speed observation of high-dimensional optical transients with picosecond resolution," Nature Communications 11, 5252 (2020).
M. Nakatsutsumi et al., "Space and time resolved measurements of the heating of solids to ten million kelvin by a petawatt laser," New Journal of Physics 10, 043046 (2008).
Y. Lai et al., "Single-Shot Ultraviolet Compressed Ultrafast Photography," Laser & Photonics Reviews 14, 2000122 (2020).
Z. Li et al., "Single-shot tomographic movies of evolving light-velocity objects," Nature Communications 5, 3085 (2014).
N. H. Matlis et al., "Single-shot ultrafast tomographic imaging by spectral multiplexing," Nature Communications 3, 1111 (2012).
E. Tokunaga et al., "Frequency-domain interferometer for femtosecond time-resolved phase spectroscopy," Optics Letters 17, 1131-1133 (1992).
J. Liang, "Punching holes in light: Recent progress in single-shot coded-aperture optical imaging," Reports on Progress in Physics (2020).
K. Egiazarian et al., "Compressed Sensing Image Reconstruction via Recursive Spatially Adaptive Filtering," in 2007 IEEE International Conference on Image Processing, 2007), I-549-I-552.
C. C. Paige et al., "LSQR: An Algorithm for Sparse Linear Equations and Sparse Least Squares," ACM Transactions on Mathematical Software (TOMS) 8, 43-71 (1982).
J. M. Bioucas-Dias et al., "A New TwIST: Two-Step Iterative Shrinkage/Thresholding Algorithms for Image Restoration," IEEE Transactions on Image Processing 16, 2992-3004 (2007).
https://link.springer.com/book/10.1007/978-3-642-00296-0—J. Benesty et al., "Pearson Correlation Coefficient," in Noise Reduction in Speech Processing, I. Cohen, Y. Huang, J. Chen, and J. Benesty, eds. (Springer Berlin Heidelberg, Berlin, Heidelberg, 2009—https://link.springer.com/book/10.1007/978-3-642-00296-0.), pp. 1-4.
X. Liu, et al., "Single-shot compressed optical-streaking ultra-high-speed photography," Optics Letters 44, 1387-1390 (2019).
G. D. Gautam et al., "Pulsed Nd:YAG laser beam drilling: A review," Optics & Laser Technology 100, 183-215 (2018).
V. Ntziachristos et al., "Fluorescence molecular tomography resolves protease activity in vivo," Nature Medicine 8, 757-761 (2002).

* cited by examiner

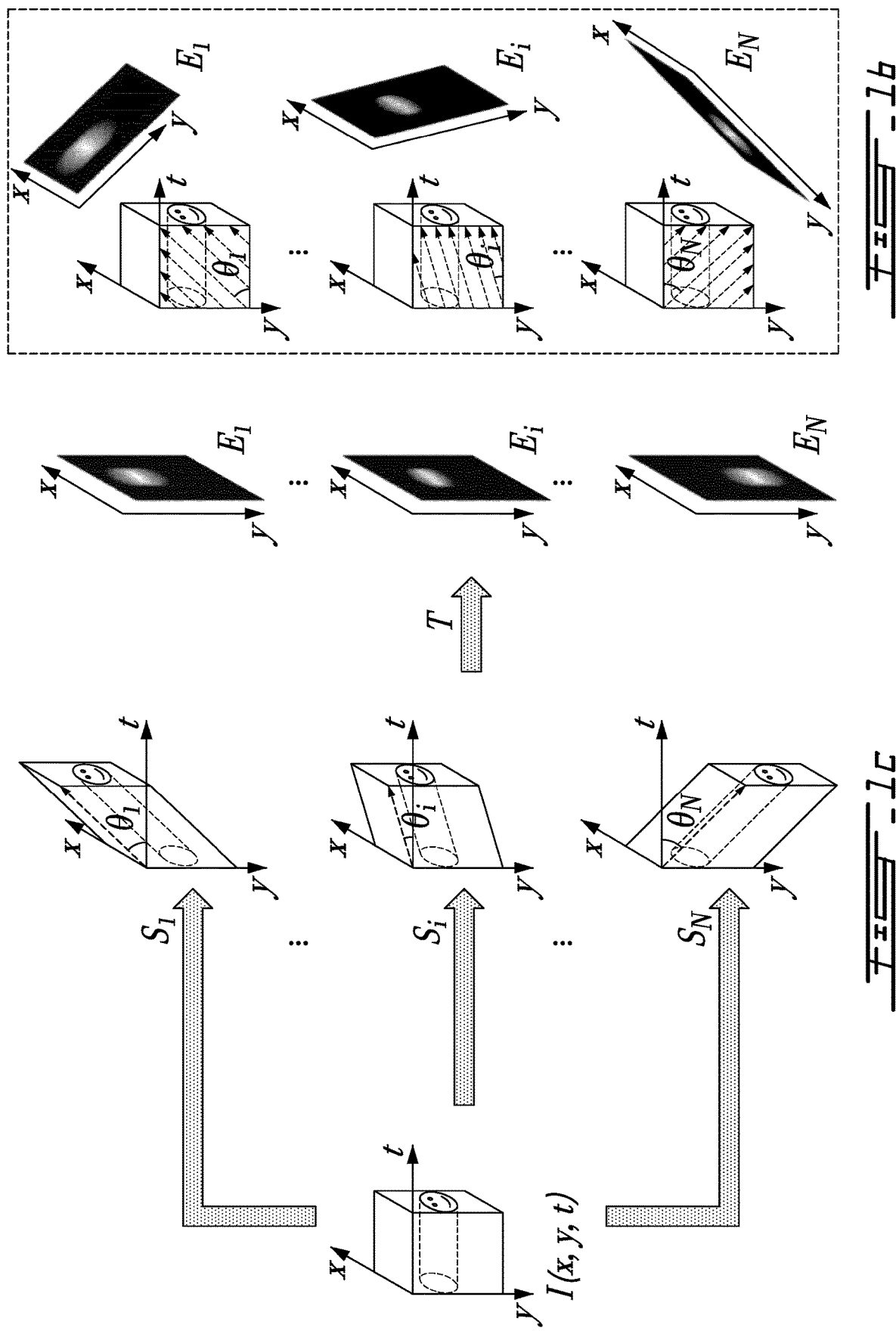

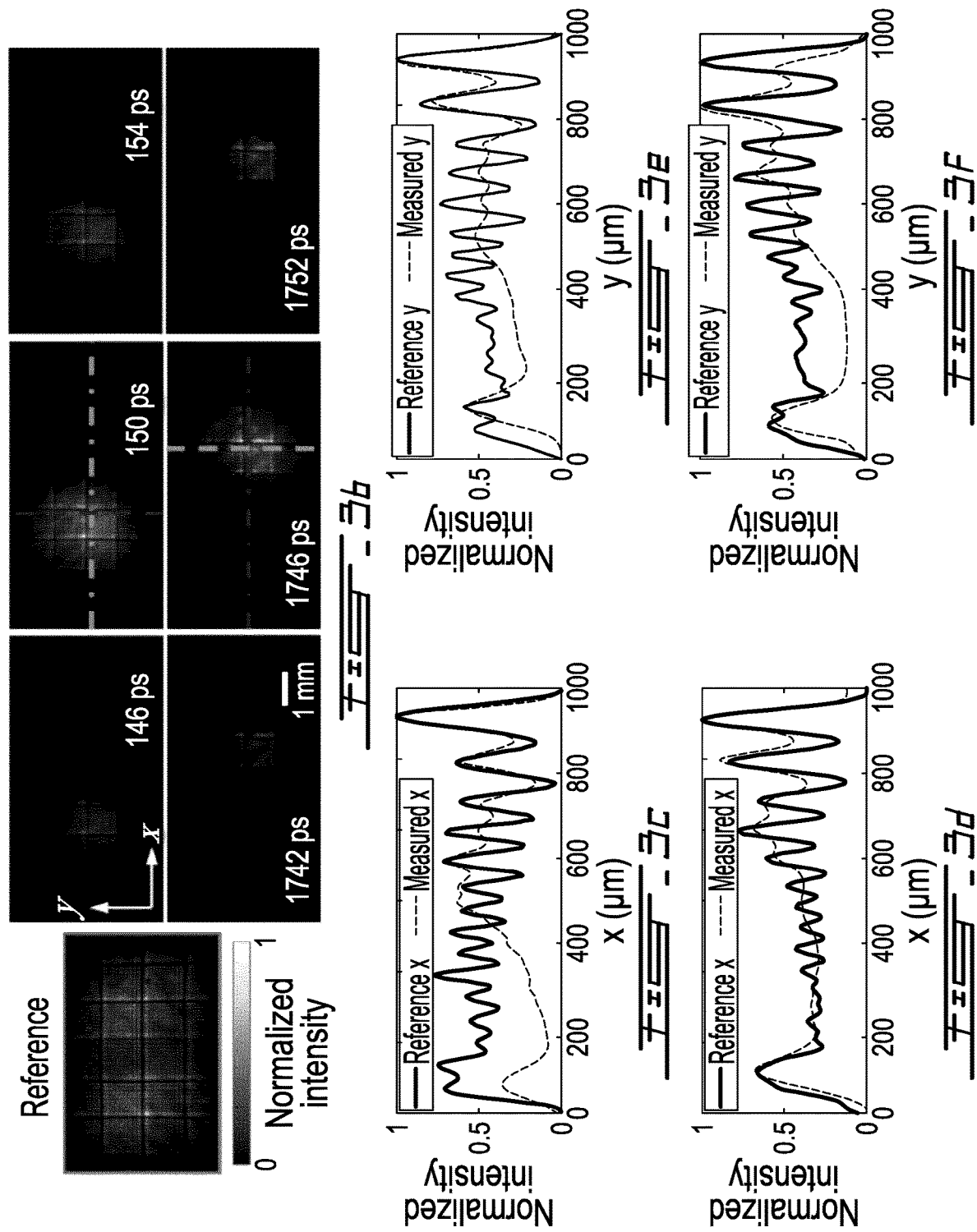

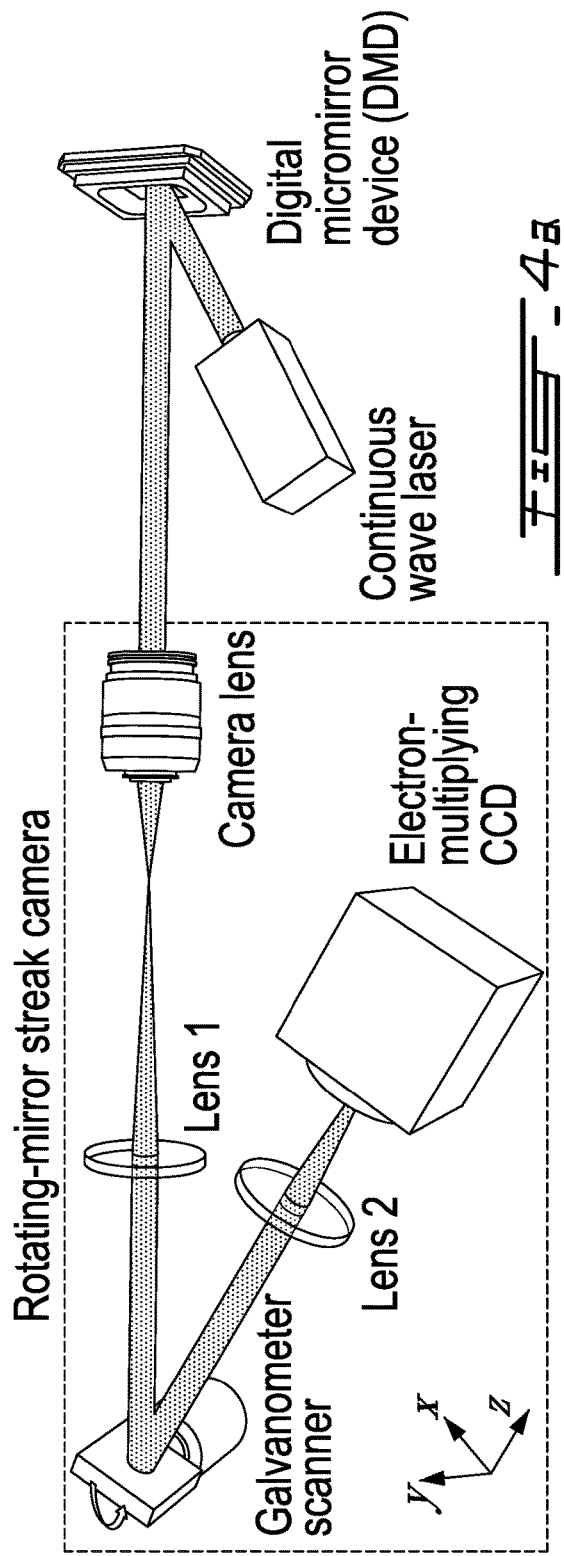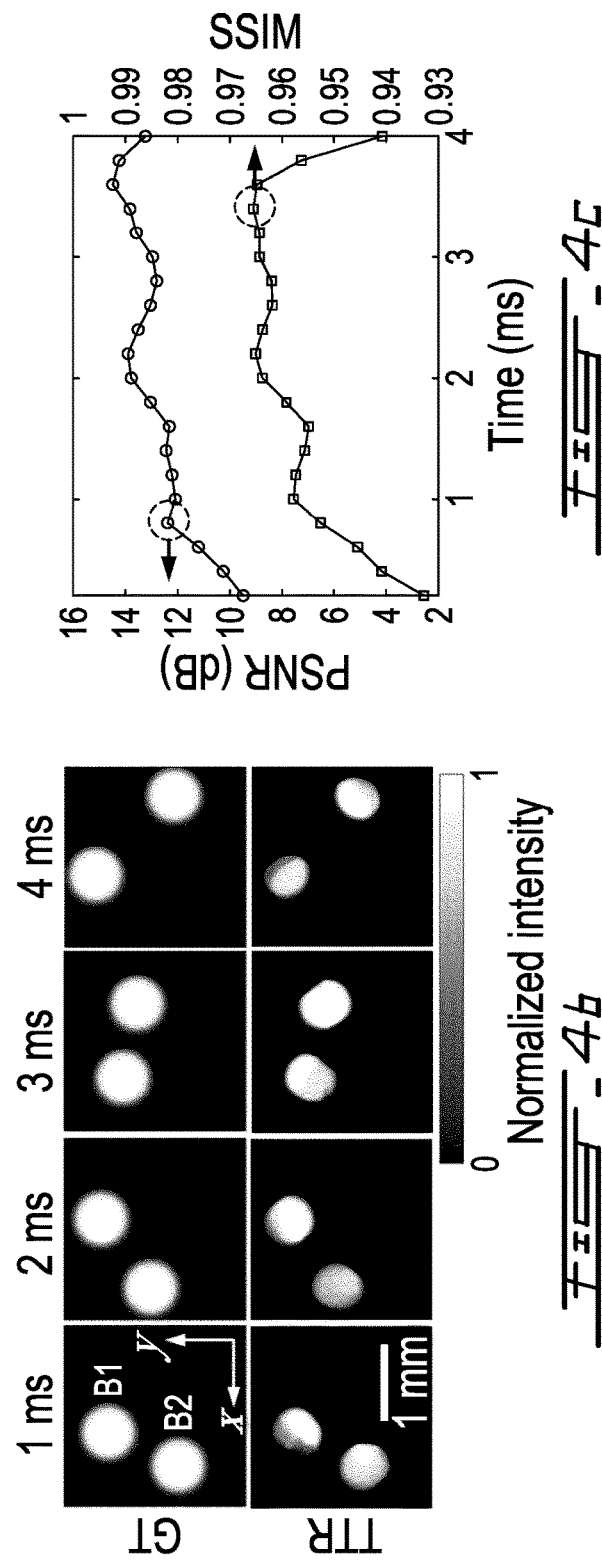

METHOD AND A SYSTEM FOR COMPRESSED ULTRAFAST TOMOGRAPHIC IMAGING

CROSS-REFERENCE TO RELATED APPLICATIONS

This application is a National Entry Application of PCT application no PCT/CA2021/051516 filed on Oct. 27, 2021 and published in English under PCT Article 21(2), which itself claims benefit of U.S. provisional application Ser. No. 63/109,025, filed on Nov. 3, 2020. All documents above are incorporated herein in their entirety by reference.

FIELD OF THE INVENTION

The present invention relates to tomographic imaging. More specifically, the present invention is concerned with a method and a system for compressed ultrafast tomographic imaging.

BACKGROUND OF THE INVENTION

Ultrafast optical imaging is used for characterizing ultrashort laser pulses and investigating laser-matter interactions for example. Advances in optoelectronic instrumentation propel ultrafast optical imaging allow increasing imaging speeds and sensitivity and broadening operating spectra.

Among existing devices, streak cameras, used to passively record dynamic events, operate by causing a time-varying deflection of light across the width of a detector; in such a way that a light pulse entering through a narrow slit along one direction is deflected in the perpendicular direction so that photons that arrive first hit the detector at a different position than photons that arrive later. Streak cameras can be used to directly measure transient optical signals with a temporal resolution down to hundreds of attosecond. In past decades, streak cameras have contributed to numerous applications in a number of fields, including chemical characterization in living cells, inertial confinement fusion, and molecular characterization for example.

Streak cameras have been greatly improved in recent years. Multiple sweep ranges with timespans from picoseconds to milliseconds are commonly implemented, and read-out cameras with several millions of pixels have become standard configurations, resulting in streak cameras with multi-scale imaging speeds from femtoseconds to microseconds. Moreover, progress on new materials for photocathodes have expanded the spectral range of streak cameras from far-infrared regions to visible and ultraviolet (UV) spectra, even to the X-ray wavelengths. Furthermore, to circumvent the space-charge effect in electron imaging and the Coulomb repulsive force in electron-photon conversion, all-optical approaches have been implemented in designing new temporal shearing units, thereby enhancing the signal-to-noise ratio in streak images and improving the temporal resolution to attoseconds.

Despite developments, streak cameras are still restricted to one-dimensional (1D) imaging in conventional operation, as, due to the time-to-space conversion in the temporal shearing operation, the temporal information occupies one spatial axis on the two-dimensional (2D) readout camera. To avoid spatiotemporal mixture, spatial information can only be recorded on the other spatial axis. Thus, a narrow entrance slit, typically between 50 and 100 μm wide, is selected to limit ultrafast imaging in a 1D field of view (FOV).

A number of 2D streak imaging approaches have been developed to overcome this limitation. In multiple-shot methods, (x,y,t) information or datacube, is acquired by combining the conventional operation of streak cameras with a scanning operation in the spatial dimension orthogonal to the spatial dimension that of the entrance slit. Although retaining the intrinsic contrast and resolutions of streak cameras, this approach requires a large number of measurements along the scanning direction to synthesize the (x,y,t) datacube. Alternatively, the (x,y,t) information can be obtained in a single measurement by synergizing streak imaging with other advanced imaging methods. For example, by implementing a compressed sensing (CS) paradigm in a streak camera, compressed ultrafast photography (CUP) compressively records a transient event into a 2D snapshot and subsequently leverages the prior knowledge and spatiotemporal sparsity to retrieve the (x,y,t) datacube. In another method, a 2D-1D fiber array is used to maps a 2D FOV to a line, and a tilted lenslet-array is implemented to generate several replicas of the dynamic event at different heights. Both methods reduce the imaging dimension to accommodate the conventional operation of the streak camera so that a 2D ultrafast movie is recovered by allocating pixels in the acquired single streak image to the correct spatiotemporal positions in the (x,y,t) datacube. Despite opening up a range of applications, these methods still reduce either the spatial and/or temporal resolutions due to spatial encoding or the field of view (FOV) due to focal plane division. Additional components need to be added in front of the streak camera to enable these operations, which results in increased system complexity, thereby limiting the application scope of these methods.

In summary, streak cameras have been widely used in time-resolved two-dimensional (2D) imaging of transient events. However, existing approaches are strained by long acquisition time, the trade-off between spatial and temporal resolutions, and/or reduced field of view. They also require either additional components or active illumination.

Despite initially developed for recording the (x,y,z) information, in recent years, a number of tomographic imaging techniques have been implemented to record spatiotemporal information. In a typical configuration, multiple identical ultrashort pulses or a spatially chirped pulse probes a transient event. The transmitted light is measured by spectral interferometry to obtain the angular projections, which are fed to reconstruction methods to recover a movie with imaging speeds up to trillions of fps (Tfps). However, relying on active laser illumination, existing ultrafast tomographic imaging techniques are not applicable to imaging self-luminescent and color-selective dynamic events.

There is still a need in the art for a method and a system for compressed ultrafast tomographic imaging.

SUMMARY OF THE INVENTION

More specifically, in accordance with the present invention, there is provided a method for compressed ultrafast tomographic imaging of dynamic events, comprising data acquisition and image reconstruction from acquired data; wherein the data acquisition comprises acquiring spatiotemporal projections I(x,y,t) of a dynamic event, temporally shearing the acquired projections and spatiotemporally integrating resulting sheared projections.

There is further provided a method for imaging a transient event, comprising passively recording spatiotemporal projections of the transient event in an angular range from −45° to +45'; and processing the recorded spatiotemporal projections by compressed sensing tomographic image reconstruction to recover the transient event.

There is further provided a system for compressed ultrafast tomographic imaging, comprising an imaging unit, a shearing unit, a detector, and a processing unit; wherein said imaging unit and said shearing unit image a dynamic event to different positions; said detector records data by spatially integrating over each pixel and temporally integrating; and said processing unit reconstruct the dynamic event from said data by compressed sensing tomographic image reconstruction.

Other objects, advantages and features of the present invention will become more apparent upon reading of the following non-restrictive description of specific embodiments thereof, given by way of example

BRIEF DESCRIPTION OF THE DRAWINGS

In the appended drawings:

FIG. 1B is a schematical view of a method according to an embodiment of an aspect of the present disclosure;

FIG. 1C shows a reconstructed image of an event according to an embodiment of an aspect of the present disclosure;

FIG. 3B shows six representative frames of reconstruction events with the reference image captured without introducing temporal shearing;

FIG. 3C shows profiles in the x-direction at t=150 ps; corresponding curves from the reference image being shown in solid lines;

FIG. 3D shows profiles in the x-direction at t=1746 ps; corresponding curves from the reference image being shown in solid lines;

FIG. 3F shows profiles in the y-directions at t=1746 ps; corresponding curves from the reference image being shown in solid lines;

FIG. 3E shows profiles in the y-directions at t=150 ps; corresponding curves from the reference image being shown in solid lines;

FIG. 4A is a schematical view of a system according to an embodiment of an aspect of the present disclosure using a rotating-mirror streak camera;

FIG. 4B shows four representative frames of the ground truth (top row) and TwIST-based tomographic reconstruction (TTR)'s reconstruction with 15 projections (bottom row);

FIG. 4C shows peak signal-to-noise ratio (PSNR) and structural similarity index measure (SSIM) of TwIST-based tomographic reconstruction (TTR)'s reconstructions;

DESCRIPTION OF ILLUSTRATIVE EMBODIMENTS

The present invention is illustrated in further details by the following non-limiting examples.

Figure 1A:
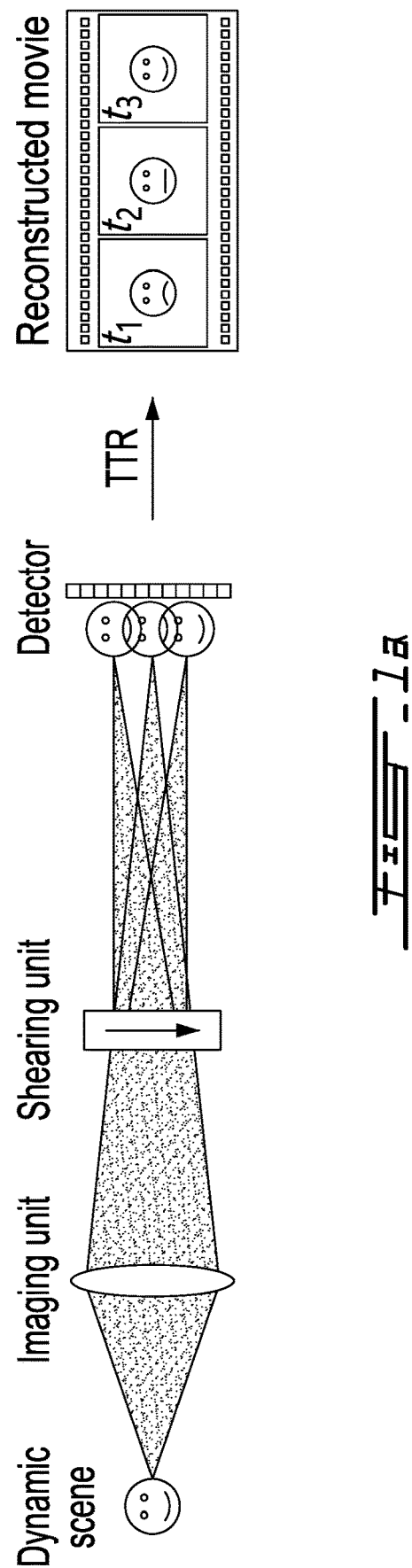
FIG. 1A is a schematical view of a system according to an embodiment of an aspect of the present disclosure.

FIG. 1A is a schematical view of a compressed ultrafast tomographic imaging (CUTI) system according to an embodiment of an aspect of the present disclosure and FIG. 1C shows the image reconstructed by TwIST-based tomographic reconstruction (TR.

As shown in FIG. 1A, a dynamic scene, referred to hereafter as a dynamic event $I(x,y,t)$ is imaged by an optic imaging element, the input event is temporally sheared to different positions by a shearing unit, and a detector records the sheared data, used for reconstruction of the event by a processing unit. In the present disclosure, a streak camera is used for directly imaging the event, the entrance port being widely open to retain 2D (x,y) information at each time point, with a temporal shearing velocity $v_i$ (i=1, 2, ..., N) in the $i^{th}$ acquisition of a N, image acquisitions by the streak camera, (see the temporal shearing operator $S_i$ in FIG. 1B); The number N of images taken by the streak camera may be as low as 5 for example, typically below about 35, depending on a target performance (see FIG. 2C). A 2D readout camera then records the data by spatially integrating over each pixel and temporally integrating over the exposure time to a snapshot $E_i$, (see the spatiotemporal integration operator in FIG. 1B). The spatiotemporal projections of $I(x,y,t)$ may then be described in the x-y-t domain (see FIG. 1B) as follows:

$$E = TS\ I(x,y,t),$$

where $E=[E_1, E_2, \ldots E_N]$ and $S=[S_1, S_2, \ldots, S_N]$ The angle of the $i^{th}$ spatiotemporal projection is $$\theta_i = \tan^{-1}\left(\frac{v_i}{|v_{max}|}\right),$$

where $|v_{max}|$ is the maximum shearing speed of the streak camera. Thus, $\theta_i \in [-45°, +45°]$.

After data acquisition, the dynamic event represented by a datacube $I(x,y,t)$ is reconstructed based on sparse-view computed tomography and two-step iterative shrinkage/thresholding (TwIST) method. In a TwIST-based tomographic reconstruction (TTR) method, with an initialization $I_0=(TS)^\tau E$, the dynamic event $I(x,y,t)$ is recovered by solving an optimization problem defined as follows:

$$\hat{I} = \underset{I}{\mathrm{argmin}}\left\{\frac{1}{2}\|E - TSI\|_2^2 + \tau\Phi_{TV}(I)\right\}, \quad (2)$$

where $\tau$ is a regularization parameter, and $\Phi_{TV}(\cdot)$ is a regularization function of total variation (TV). The reconstructed datacube has a sequence depth, which represents the number of frames, of $N_f = rT_s$, where $T_s$, is the sweep time, $$r = \frac{|v_{max}|}{P_c}$$

is the imaging speed of the compressed ultrafast tomographic imaging (CUTI) method, and $P_c$ is the pixel size of the readout camera. Each frame in the datacube has a (x,y) size of $N_x \leq N_b$ and $N_y \leq N_v - N_f + 1$ pixels. $N_b$ and $N_v$ are the horizontal and vertical pixel counts of the readout camera.

FIG. 1C illustrates equivalent spatiotemporal projections in data acquisition.

The streak camera may be an image-converter streak camera, a rotating-mirror streak camera. The detector may be an electron-multiplying charge-coupled device (CCD), a complementary metal-oxide-semiconductor (CMOS) camera or a scientific CMOS camera (sCMOS) for example Andor Zyla 5.5 sCMOS camera. The processing unit is typically a computer.

The method generally comprises temporal shearing and spatiotemporal integration to passively perform projections of a transient event. By leveraging multiple sweep ranges of a standard streak camera and compressed sensing (CS)-based reconstruction, the (x,y,t) datacube of the transient event is accurately reconstructed using as low as 5 streak images for example. Thus, the present compressed ultrafast tomographic imaging (CUTI) system and method passively record 2D transient events with an unmodified streak camera, apply computed tomography to the spatiotemporal domain, to equivalently express the operations of temporal shearing and spatiotemporal integration of the data acquisition of the streak camera by the spatiotemporal projection of an (x,y,t) datacube from a given angle; and use a compressed-sensing reconstruction method to accurately recover the 2D transient event, in a few measurements.

The compressed ultrafast tomographic imaging (CUTI) method was first tested by simulating the data acquisition and the image reconstruction of a jellyfish event with the preset size of $N_x \times N_y \times N_f = 512 \times 512 \times 80$ pixels. Five projections, from −45° to +45° with an angular step of 22.5°, were applied to the jellyfish event according to relation (1) above. All the projections were input to the TwIST-based tomographic reconstruction (TTR) method (with τ=0.0059) for image reconstruction. To compare the reconstructed image quality, the image reconstructions were also tested using the methods of back projection (BP), recursive spatially adaptive filtering (RSAF), and least squares (LSQR).

Figure 2A:
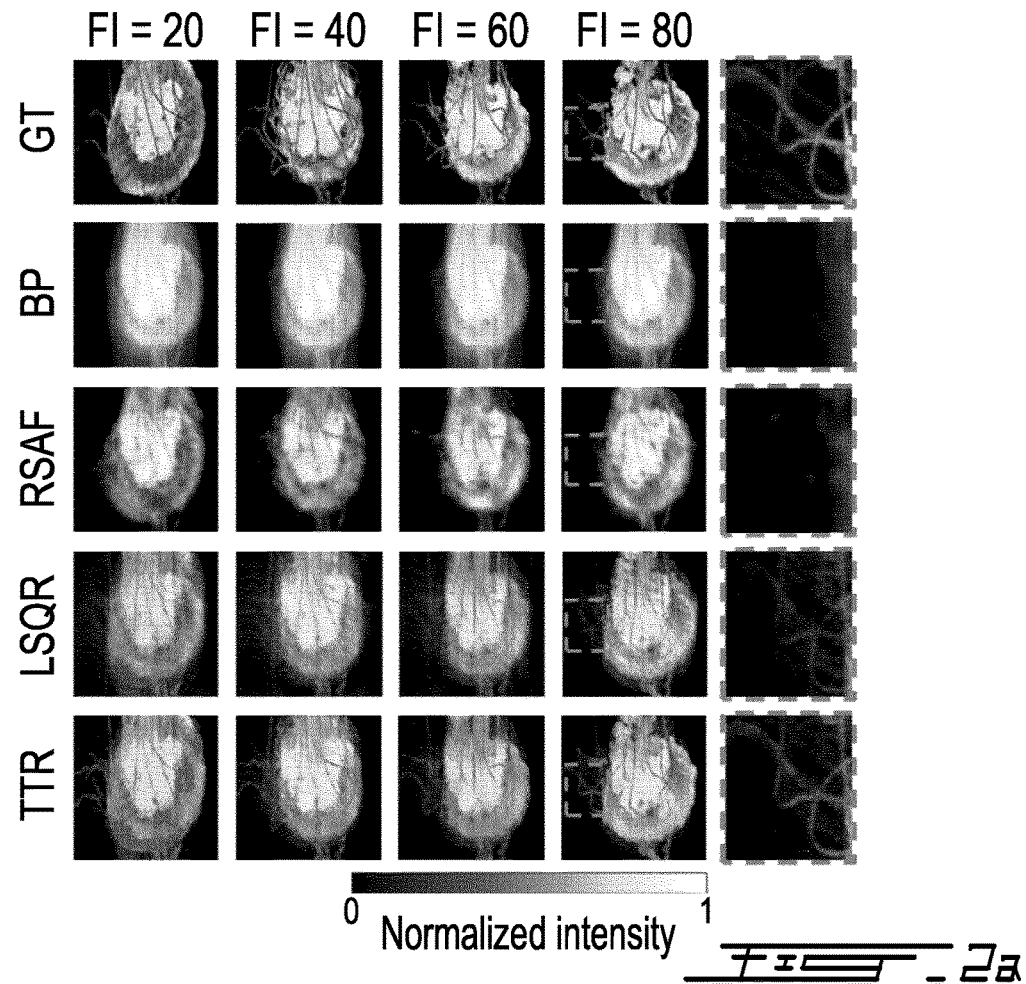
FIG. 2A shows a comparison of the ground truth (GT) with reconstruction using four representative frames at specific frame indexes (FI) of reconstructions with five projections reconstructed by back projection (BP), recursive spatially adaptive filtering (RSAF) [29], least squares (LSQR) [30], and two-step iterative shrinkage/thresholding (TwIST)-based tomographic reconstruction (TTR), the last column showing zoomed-in views of a local feature in the 80th frame, marked by the dashed box.
Figure 2B:
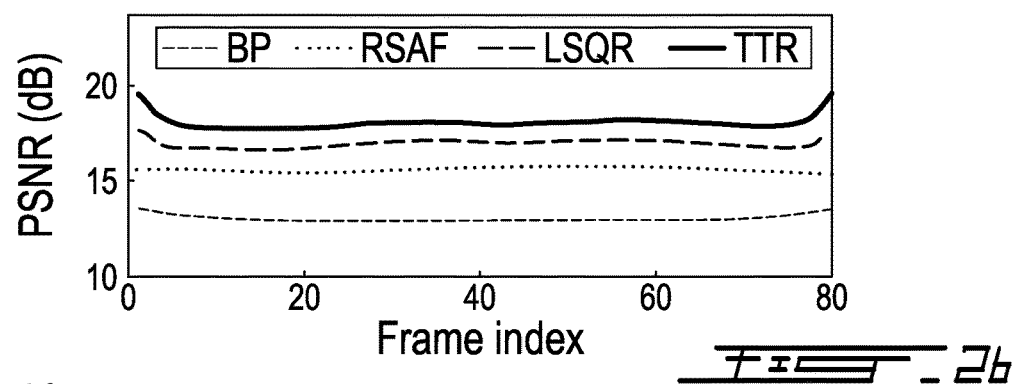
FIG. 2B shows a comparison of the ground truth (GT) with reconstruction using peak signal-to-noise ratio (PSNR) of the reconstructed results in FIG. 2A.

The reconstructed images by each one of the four methods are compared with the reference or ground truth (GT) in FIG. 2. Four representative frames are shown in FIG. 2A. Zoomed-in views show jellyfish's tentacles in the $80^{th}$ frames of the ground truth (GT) and the different reconstructions.

Figure 2C:
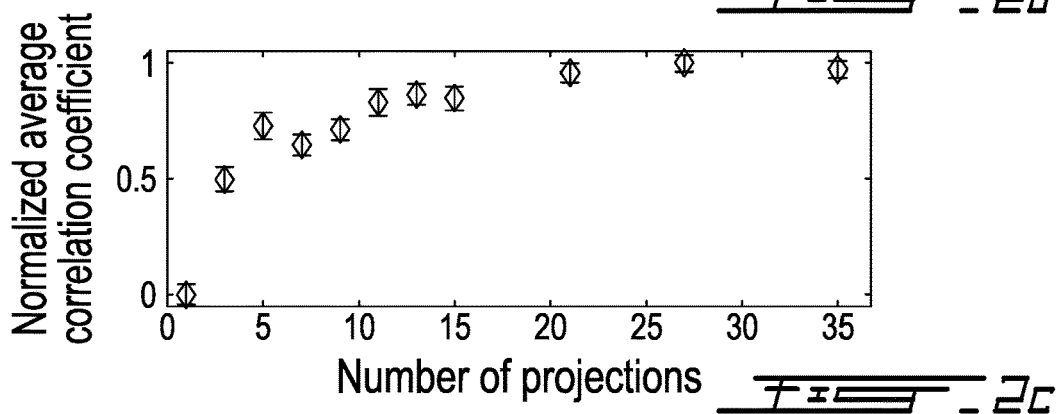
FIG. 2C shows a comparison of the ground truth (GT) with reconstruction using analysis of the normalized average correlation coefficient of TwIST-based tomographic reconstruction (TTR)'s reconstruction with different numbers of projections, the error bar showing standard deviation.

These results show that the TwIST-based tomographic reconstruction (TTR) can recover more spatial details than back projection (BP) and recursive spatially adaptive filtering (RSAF) reconstructions, and has fewer artifacts than least squares (LSQR) reconstruction. To quantitatively evaluate the different reconstruction methods, the peak signal-noise ratio (PSNR) of each frame in the reconstructed movies (FIG. 2B) were analyzed, which shows the superior performance of the TwIST-based tomographic reconstruction (TTR). Besides, to analyze the relationship between reconstructed image quality and the number of projections, twelve datacubes were reconstructed by the TwIST-based tomographic reconstruction (TTR) with a number of projections from 1 to 35 (FIG. 2C). For each number of projections, the angles were uniformly distributed from −45° to +45°. The normalized average correlation coefficient [32] between each reconstructed datacube and the ground truth (GT) was calculated. The results also show that a reconstruction of good quality, i.e., with a normalized average correlation coefficient larger than 0.8, is achieved in compressed ultrafast tomographic imaging (CUTI) with about 10 projections.

Figure 3A:
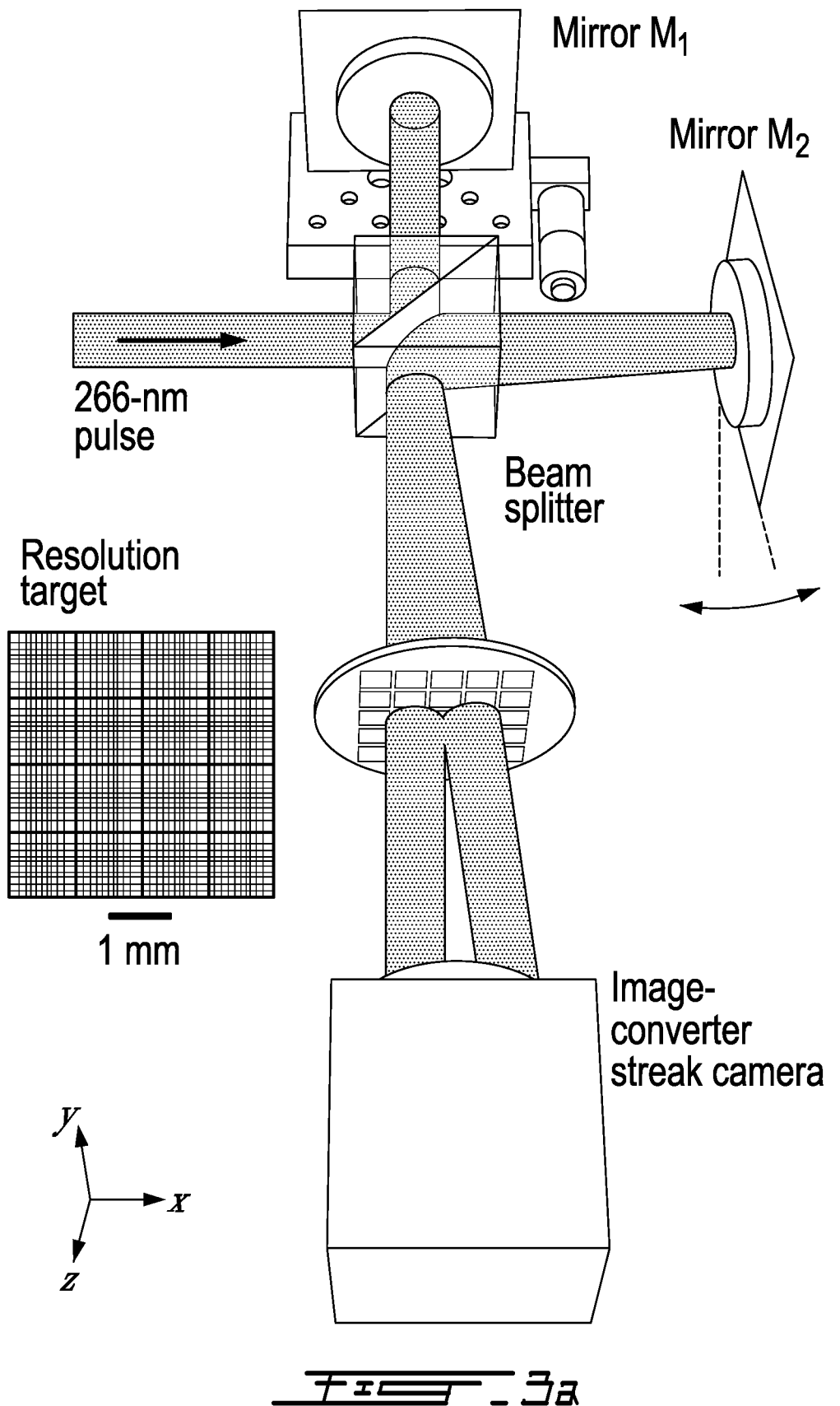
FIG. 3A is a schematical view of a system for compressed ultrafast tomographic imaging according to an embodiment of an aspect of the present disclosure using an image-converter streak camera.

To demonstrate the compressed ultrafast tomographic imaging (CUTI) method with an image-converter streak camera, a dynamic event of two UV laser pulses sequentially transmitting through a resolution target was imaged. As shown in FIG. 3A, a 266-nm, 100-fs laser pulse was split into two arms by a beam splitter. In each arm, the laser pulse was retro-reflected by a mirror. A manual translation stage was added into one arm to generate a 1.6-ns time delay. The mirror $M_2$ was slightly tilted with respect to the normal of the incident beam to generate a lateral shift to the reflected pulse. These two spatially and temporally separated UV pulses transmitting through the resolution target that contains engraved patterns are shown in the inset in FIG. 3A.

The compressed ultrafast tomographic imaging (CUTI) imaged this transient event using a UV-streak camera (AXIS-PX, Axis Photonique), of a maximum shearing velocity of $|v_{max}|=10$ µm/ps, a sweep time of $T_s=2.8$ ns, and a pixel size of $P_s=20$ µm (2×2 binning). The compressed ultrafast tomographic imaging (CUTI)'s imaging speed was determined to r=0.5 Tfps, with a sequence depth $N_f=1400$ frames with each frame size of $N_x \times N_y=1024 \times 1024$ pixels. 11 projections were acquired from −45° to +45° with an angular step of 9°. The regularization parameter was set to τ=0.0204. Six selected frames are presented in FIG. 3B, showing the temporal intensity changes of two laser pulses whose spatial profiles are modulated by the resolution target.

To quantify the spatial resolution, selected cross-sections in the first pulse (at t=150 ps) and the second pulse (at t=1746 ps) were extracted, as shown in FIGS. 3C, 3E and 3D, 3F. These results are compared with the reference image captured without introducing temporal shearing. Using a 10% contrast as the criterion, at t=150 ps, the spatial resolutions were determined as 15.6 lp/mm and 14.1 lp/mm in the x- and y-directions, respectively. At t=1746 ps, these values were 13.2 lp/mm and 14.1 lp/mm. The slight decrease of spatial resolutions in the second pulse was attributed to the stronger image distortion at the bottom of the streak image.

To demonstrate compressed ultrafast tomographic imaging (CUTI) with a rotating-mirror streak camera, fast-moving ball patterns were imaged at 5 thousand fps (kfps). This datacube was loaded and repeatedly played by a digital micromirror device (DMD). A collimated laser beam from a continuous-wave laser, shone onto the digital micromirror device (DMD) at an incident angle of about 24°, was diffracted by the patterns. This event was captured by an optical rotating-mirror streak camera built in-house [33], that uses a galvanometer scanner for temporal shearing and an electron-multiplying CCD for spatiotemporal integration (FIG. 4A). The maximum shearing velocity is $v_{max}=30.0$ µm/ms with a sweep time of $T_s=50$ ms and the pixel size $P_c=5$ µm. Thus, compressed ultrafast tomographic imaging (CUTI) has operated at r=5 kfps with a sequence depth of $N_f=250$ frames, and image size of $N_x \times N_y=512 \times 512$ pixels. 15 projections (from −45° to +45° with an angular step of 6.4°) were recorded in this experiment, and the regularization parameter was set to τ=0.0463.

Figures 4D, 4E:
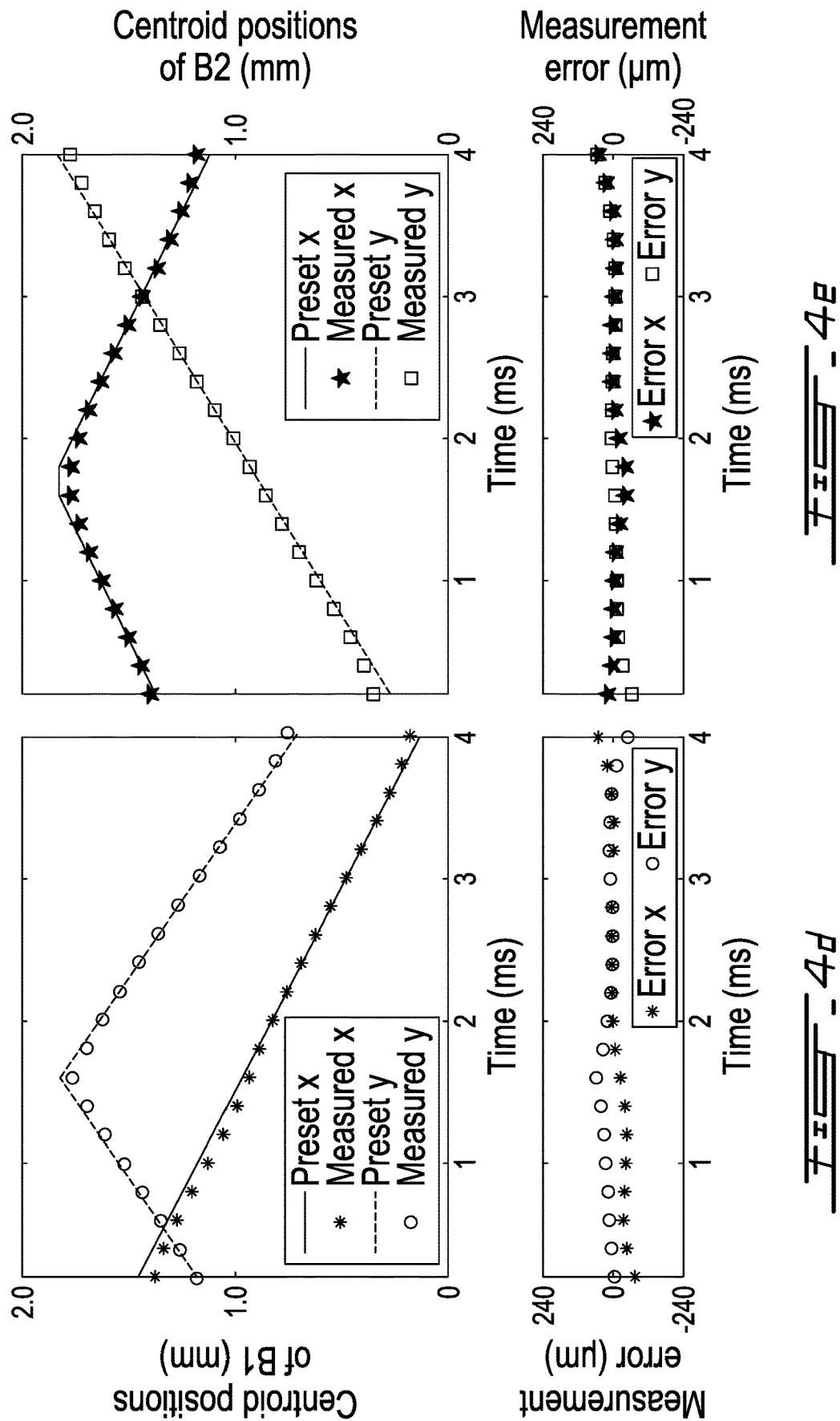
FIG. 4D shows tracing centroids of B1 in FIG. 4B.
FIG. 4E shows tracing centroids of B2 in FIG. 4B.

FIG. 4B presents selected frames of the ground truth (GT) and the TwIST-based tomographic reconstruction (TTR)- reconstructed results. To evaluate compressed ultrafast tomographic imaging (CUTI)'s reconstruction performance, the peak signal-to-noise ratio (PSNR) and structural similarity index measure (SSIM) of TwIST-based tomographic reconstruction (TTR)'s output were calculated (FIG. 4C). Moreover, the centroids of each ball (labeled as B1 and B2 in the first panel of FIG. 4B) were traced (FIG. 4D). The measurement errors were measured by subtracting the measured position of centroids from the pre-set centroids. The root-mean-square errors of reconstructed centroids along the x and y directions were calculated to be 19.18 µm and 19.16 µm for B1, and 18.36 µm and 18.03 µm for B2, respectively. These results confirm compressed ultrafast tomographic imaging (CUTI) feasibility with rotating-mirror streak cameras.

As people in the art will now be in a position to appreciate, the present compressed ultrafast tomographic imaging (CUTI) method synergizes streak imaging, tomographic imaging, and compressed sensing (CS). By implementing tomography in the spatiotemporal domain, the present compressed ultrafast tomographic imaging (CUTI) method passively records the spatiotemporal projections in an angular range from −45° to +45°. The acquired projections are processed by a newly developed TTR method to accurately recover the dynamic event. Implemented in an image-converter streak camera, the present compressed ultrafast tomographic imaging (CUTI) method captured the time of arrival of two spatially modulated UV pulses at 0.5 Tfps with a datacube of 1024×1024×1400 (x,y,t) pixels in size. Applied to a rotating-mirror streak camera, the present compressed ultrafast tomographic imaging (CUTI) method imaged fast-moving ball patterns at 5 kfps with a datacube size of 512×512×250 (x,y,t) pixels.

In summary, for a transient event I(x,y,t), the method comprises acquiring a few number N with various shear velocities. The streak images with different shear velocities, along the y axis, can be treated as the different angular projections in temporal dimension, in the (y,t) plane. These streak images are processed by compressed sensing tomographic image reconstruction to recover the movie without the sacrifices of spatial resolution.

The present compressed ultrafast tomographic imaging (CUTI) method, as a universal scheme, can be readily applied to streak cameras without modification of the streak cameras. Compared to scanning-based multiple-shot approaches, the present compressed ultrafast tomographic imaging (CUTI) method only requires a few measurements to accurately reconstruct the datacube. Compared to the single-shot methods, the present compressed ultrafast tomographic imaging (CUTI) method eliminates the trade between streak camera's spatiotemporal resolution or field of view to temporal resolution. Thus, a new operation mode to streak cameras for 2D time-resolved imaging is presented. The present compressed ultrafast tomographic imaging (CUTI) method may find many new applications in laser manufacturing [34] and biomedicine [35].

The present ultrafast imaging method and system synergize streak imaging, tomographic imaging, and compressed sensing to passively capture transient dynamics.

The present compressed ultrafast tomographic imaging (CUTI) method and system have demonstrated an imaging speed of 0.5 trillion frames per second (Tfps).

The present compressed ultrafast tomographic imaging (CUTI) method and system achieve 2D streak imaging based on unmodified streak cameras. Compared to existing streak-camera-based 2D imaging modalities, the present compressed ultrafast tomographic imaging (CUTI) method and system overcome their limitations in field of view, imaging speeds, and spatial and/or temporal resolutions.

A two-step iterative shrinkage/thresholding (TwIST)-based tomographic reconstruction (TTR) method is implemented for compressed ultrafast tomographic imaging (CUTI)'s image reconstruction, thus reducing the number of measurements and the acquisition time, while improving the reconstructed image quality.

Compressed ultrafast tomographic imaging (CUTI) systems based on unmodified streak cameras open up opportunities for weight- and size-limiting applications as well as great potential for industrial adaptation and commercialization.

Compressed ultrafast tomographic imaging offers a new strategy for tomographic imaging. TwIST-based tomographic reconstruction (TTR) is a universal platform applicable to many tomographic imaging systems with a boosted reconstruction performance.

In a nutshell, the method and the system according to the present disclosure use tomographic imaging in the spatiotemporal domain to overcome the limitations in existing 2D streak imaging methods.

A method according to an embodiment of an aspect of the present disclosure generally comprises temporal shearing and spatiotemporal integration to passively perform projections of a transient event. By leveraging multiple sweep ranges readily available in a standard streak camera and a compressed sensing (CS)-based reconstruction method, the (x,y,t) datacube of the transient event is accurately reconstructed using a few streak images.

The present compressed ultrafast tomographic imaging (CUTI) passively records 2D transient events with an unmodified streak camera. By applying the concept of computed tomography to the spatiotemporal domain, the operations of temporal shearing and spatiotemporal integration in the streak camera's data acquisition can be equivalently expressed by the spatiotemporal projection of an (x,y,t) datacube from a given angle. Using a compressed-sensing reconstruction method, the 2D transient event can be accurately recovered in a few measurements. The present compressed ultrafast tomographic imaging (CUTI) was demonstrated by imaging two ultrashort UV laser pulses transmitting through a resolution target using an image-converter streak camera at 0.5 trillion frames-per-second. The present compressed ultrafast tomographic imaging (CUTI) was also applied to imaging an animation of fast-bouncing balls using a rotating-mirror streak camera at 5 thousand frames-per-second. The present compressed ultrafast tomographic imaging (CUTI) is universally adaptable by most streak cameras and may find applications in both industrial and scientific communities.

The present method and system integrate compressive sensing, tomographic imaging, and streak imaging to achieve ultrafast imaging. Different shearing velocities are used to acquire the measurements and (x,y,t) information is recovered using compressive-sensing.

The scope of the claims should not be limited by the embodiments set forth in the examples, but should be given the broadest interpretation consistent with the description as a whole.

The invention claimed is:

1. A method for compressed ultrafast tomographic imaging of dynamic events, comprising data acquisition and image reconstruction from acquired data; wherein said data acquisition comprises acquiring spatiotemporal projections I(x,y,t) of a dynamic event, temporally shearing the acquired projections and spatiotemporally integrating resulting sheared projections, wherein the dynamic event is directly imaged by a streak camera with shearing velocities $v_i$ (i=1, 2, ..., N) where N is an integer; a 2D readout camera spatially integrates over each pixel and temporally integrates over the exposure time to a snapshot $E_i$, and the spatiotemporal projections of I(x,y,t) are r described in the x-y-t domain as follows:

$$E = TS\ I(x,y,t),$$

where $E=[E_1, E_2, E_N]^T$ and $S=[S_1, S_2, S_N]^T$, an angle of a $i^{th}$ spatiotemporal projection being $$\theta_i = \tan^{-1}\left(\frac{v_i}{|v_{max}|}\right),$$

where $|v_{max}|$ is a maximum shearing velocity of the streak camera; and wherein said image reconstruction comprises building a sparse matrix and recovering the dynamic event by solving an optimization problem defined with an initialization $\hat{I}_0 = (TS)^T E$, as follows:

$$\hat{I} = \underset{I}{\mathrm{argmin}}\left\{\frac{1}{2}\|E - TSI\|_2^2 + \tau \Phi_{TV}(I)\right\},$$

where $\tau$ is a regularization parameter, and $\Phi_{TV}(I)$ is a regularization function of total variation TV; and resulting reconstructed spatiotemporal projections I(x,y,t) of the dynamic event have a sequence depth of $N_t = rT_s$, where $T_s$ is a sweep time, $$r = \frac{|v_{max}|}{P_c}$$

is an imaging speed, and $P_c$ is a pixel size of the readout camera, each frame in the spatiotemporal projections I(x,y,t) having a (x,y) size of $N_x \leq N_b$ and $N_y \leq N_v - N_t + 1$ pixels $N_b$ and $N_v$ being horizontal and vertical pixel counts of the readout camera, the reconstruction being done by a processing unit.

2. A method for imaging a transient event, comprising passively recording spatiotemporal projections of the transient event in an angular range from −45° to +45°; and processing the recorded spatiotemporal projections by compressed sensing tomographic image reconstruction to recover the transient event, the method comprising data acquisition and image reconstruction from acquired data; wherein said data acquisition comprises acquiring spatiotemporal projections I(x,y,t) of the transient event, temporally shearing the acquired projections and spatiotemporally integrating resulting sheared projections, wherein the transient event is directly imaged by a streak camera with shearing velocities $v_i$ (i=1, 2, N) where N is an integer; a 2D readout camera spatially integrates over each pixel and temporally integrates over the exposure time to a snapshot $E_i$, and the spatiotemporal projections of I(x,y,t) are r described in the x-y-t domain as follows:

$$E = TS\ I(x,y,t),$$

where $E=[E_1, E_2, E_N]^T$ and $S=[S_1, S_2, S_N]^T$, an angle of a $i^{th}$ spatiotemporal projection being $$\theta_i = \tan^{-1}\left(\frac{v_i}{|v_{max}|}\right),$$

where $|v_{max}|$ is a maximum shearing velocity of the streak camera; and wherein said image reconstruction comprises building a sparse matrix and recovering the dynamic event by solving an optimization problem defined with an initialization $\hat{I}_0 = (TS)^T E$, as follows:

$$\hat{I} = \underset{I}{\mathrm{argmin}}\left\{\frac{1}{2}\|E - TSI\|_2^2 + \tau \Phi_{TV}(I)\right\},$$

where $\tau$ is a regularization parameter, and $\Phi_{TV}(I)$ is a regularization function of total variation TV; and resulting reconstructed spatiotemporal projections I(x,y,t) of the dynamic event have a sequence depth of $N_t = rT_s$, where $T_s$ is a sweep time, $$r = \frac{|v_{max}|}{P_c}$$

is an imaging speed, and $P_c$ is a pixel size of the readout camera, each frame in the spatiotemporal projections I(x,y,t) having a (x,y) size of $N_x \leq N_b$ and $N_y \leq N_v - N_t + 1$ pixels $N_b$ and $N_v$ being horizontal and vertical pixel counts of the readout camera, the reconstruction being done by a processing unit.

3. The method of claim 2, comprising using an image-converter streak camera.

4. The method of claim 2, comprising using a rotating-mirror streak camera.

5. The method of claim 2, comprising acquiring 2D streak images with different shear velocities; treating the streak images at the different shear velocities as corresponding different angular projections in temporal dimension; and processing the streak images by the compressed sensing tomographic image reconstruction to recover the transient event.

6. The method of claim 2, comprising temporal shearing and spatiotemporal integration.

7. A system for compressed ultrafast tomographic imaging, comprising an imaging unit, a shearing unit, a detector, and a processing unit; wherein said imaging unit and said shearing unit image a dynamic event to different positions; said detector records data by spatially integrating over each pixel and temporally integrating; and said processing unit reconstruct the dynamic event from said data by compressed sensing tomographic image reconstruction, the system comprising a streak camera imaging the dynamic event by taking N images with shearing velocities $v_i$ (i=1, 2, N) where N is an integer; and a 2D readout camera that spatially integrates over each pixel and temporally integrates over the exposure time to a snapshot $E_i$, yielding spatiotemporal projections of I(x,y,t) described in a x-y-t domain as follows:

$$E = TS\ I(x,y,t),$$

where $E=[E_1, E_2, E_N]^T$ and $S=[S_1, S_2, S_N]^T$, an angle of a $i^{th}$ spatiotemporal projection being $$\theta_i = \tan^{-1}\left(\frac{v_i}{|v_{max}|}\right),$$

where $|v_{max}|$ is a maximum shearing velocity of the streak camera; wherein said processing image reconstruct the dynamic event by building a sparse matrix and recovering the dynamic event by solving an optimization problem defined with an initialization $\hat{I}_0=(TS)^T E$, as follows:

$$\hat{I} = \underset{I}{\mathrm{argmin}}\left\{\frac{1}{2}\|E - TSI\|_2^2 + \tau\Phi_{TV}(I)\right\},$$

where $\tau$ is a regularization parameter, and $\Phi_{TV}(I)$ is a regularization function of total variation TV; and resulting reconstructed spatiotemporal projections $I(x,y,t)$ of the dynamic event have a sequence depth of $N_t=rT_s$, where $T_s$ is a sweep time, $$r = \frac{|v_{max}|}{P_c}$$

is an imaging speed, and $P_c$ is a pixel size of the readout camera, each frame in the spatiotemporal projections $I(x,y,t)$ having a $(x,y)$ size of $N_x \leq N_b$ and $N_y \leq N_v - N_t + 1$ pixels $N_b$ and $N_v$ being horizontal and vertical pixel counts of the readout camera.

8. The system of claim 7, wherein said imaging unit and said shearing unit are provided as a streak camera.

9. The system of claim 7, wherein said imaging unit and said shearing unit are provided as an image-converter streak camera.

10. The system of claim 7, wherein said imaging unit and said shearing unit are provided as a rotating-mirror streak camera.

11. The system of claim 7, wherein said shearing unit comprises a galvanometer scanner.

12. The system of claim 7, wherein said detector is one of: electron-multiplying charge-coupled devices (CCD), complementary metal-oxide-semiconductor (CMOS) cameras, and scientific CMOS cameras.

* * * * *